US010304953B2

(12) United States Patent
Aichinger et al.

(10) Patent No.: US 10,304,953 B2
(45) Date of Patent: May 28, 2019

(54) SEMICONDUCTOR DEVICE WITH STRIPE-SHAPED TRENCH GATE STRUCTURES, TRANSISTOR MESAS AND DIODE MESAS

(71) Applicant: Infineon Technologies AG, Neubiberg (DE)

(72) Inventors: Thomas Aichinger, Villach (AT); Dethard Peters, Hoechstadt (DE); Ralf Siemieniec, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/975,385

(22) Filed: Dec. 18, 2015

(65) Prior Publication Data

US 2016/0190301 A1    Jun. 30, 2016

(30) Foreign Application Priority Data

Dec. 22, 2014    (DE) .................. 10 2014 119 465

(51) Int. Cl.
*H01L 29/78*    (2006.01)
*H01L 29/04*    (2006.01)
(Continued)

(52) U.S. Cl.
CPC ...... *H01L 29/7804* (2013.01); *H01L 27/0207* (2013.01); *H01L 27/0629* (2013.01);
(Continued)

(58) Field of Classification Search
CPC ............. H01L 27/0629; H01L 27/0727; H01L 29/7397; H01L 29/7804; H01L 29/7813;
(Continued)

(56) References Cited

U.S. PATENT DOCUMENTS 6,008,520 A * 12/1999 Darwish ............. H01L 29/7813
257/330
2006/0076617 A1 * 4/2006 Shenoy ............... H01L 29/0623
257/333

(Continued)

FOREIGN PATENT DOCUMENTS

DE    102004029297 A1    11/2005
DE    102005041358 A1    3/2007
(Continued)

*Primary Examiner* — Matthew C Landau
*Assistant Examiner* — Mark Hatzilambrou
(74) *Attorney, Agent, or Firm* — Murphy, Bilak & Homiller, PLLC

(57) ABSTRACT

A semiconductor device includes stripe-shaped trench gate structures that extend in a semiconductor body along a first horizontal direction. Transistor mesas between neighboring trench gate structures include body regions and source zones, wherein the body regions form first pn junctions with a drift structure and second pn junctions with the source zones. The source zones directly adjoin two neighboring trench gate structures, respectively. Diode mesas that include at least portions of diode regions form third pn junctions with the drift structure. The diode mesas directly adjoin two neighboring trench gate structures, respectively. The transistor mesas and the diode mesas alternate at least along the first horizontal direction.

19 Claims, 13 Drawing Sheets

(51) Int. Cl.
*H01L 29/16* (2006.01)
*H01L 27/02* (2006.01)
*H01L 27/06* (2006.01)
*H01L 29/06* (2006.01)
*H01L 29/08* (2006.01)
*H01L 29/10* (2006.01)
*H01L 29/423* (2006.01)
*H01L 29/739* (2006.01)
*H01L 29/861* (2006.01)
*H01L 27/07* (2006.01)

(52) U.S. Cl.
CPC ............ *H01L 29/04* (2013.01); *H01L 29/045* (2013.01); *H01L 29/0692* (2013.01); *H01L 29/0696* (2013.01); *H01L 29/0865* (2013.01); *H01L 29/1095* (2013.01); *H01L 29/1608* (2013.01); *H01L 29/4236* (2013.01); *H01L 29/7397* (2013.01); *H01L 29/7813* (2013.01); *H01L 27/0727* (2013.01); *H01L 29/861* (2013.01)

(58) Field of Classification Search
CPC ............ H01L 27/0207; H01L 29/0865; H01L 29/1095; H01L 29/739
See application file for complete search history.

(56) References Cited

U.S. PATENT DOCUMENTS

| | | | | |
|---|---|---|---|---|
| 2006/0246650 | A1* | 11/2006 | Williams | H01L 29/66734 438/212 |
| 2008/0121989 | A1* | 5/2008 | Kocon | H01L 29/0696 257/328 |
| 2008/0315250 | A1* | 12/2008 | Onozawa | H01L 29/0834 257/139 |
| 2010/0308401 | A1* | 12/2010 | Narazaki | H01L 29/4236 257/330 |
| 2013/0168701 | A1* | 7/2013 | Kiyosawa | H01L 21/0475 257/77 |
| 2013/0341711 | A1* | 12/2013 | Matsumoto | H01L 29/4236 257/330 |

FOREIGN PATENT DOCUMENTS

| | | |
|---|---|---|
| JP | H11154748 A | 6/1999 |
| JP | 2000031484 A | 1/2000 |
| JP | 2007080971 A | 3/2007 |
| JP | 2007221012 A | 8/2007 |
| JP | 2008108824 A | 5/2008 |
| JP | 2009117593 A | 5/2009 |
| JP | 2009187966 A | 8/2009 |
| JP | 2013214661 A | 10/2013 |
| JP | 2014003191 A | 1/2014 |
| JP | 2014075582 A | 4/2014 |

* cited by examiner

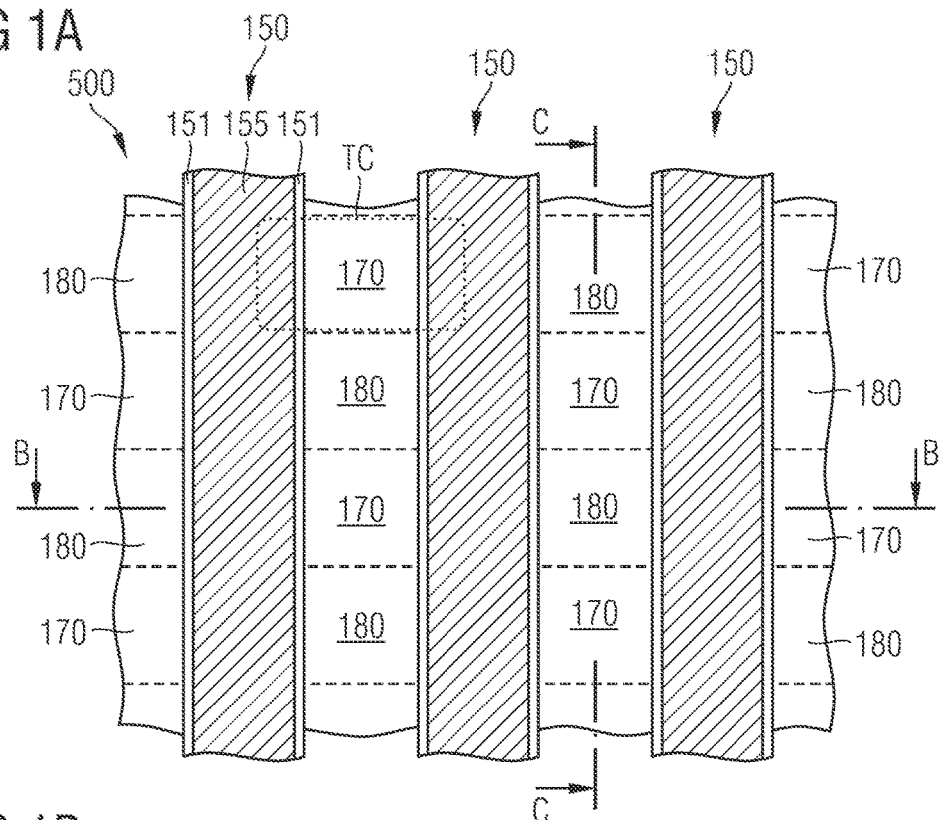
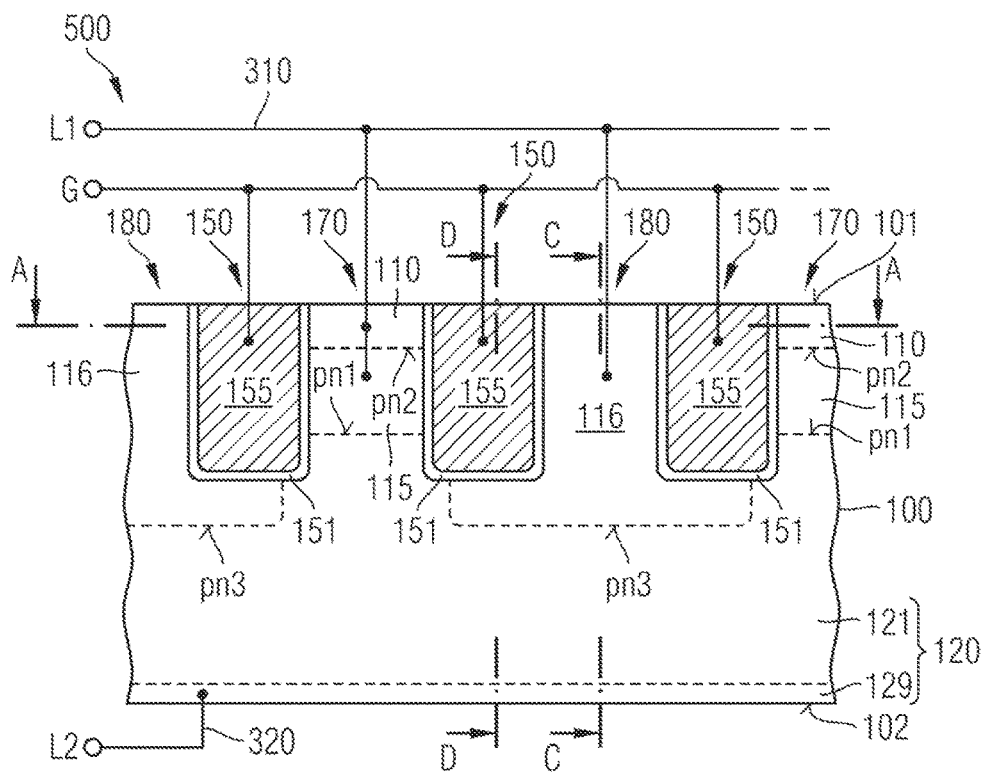

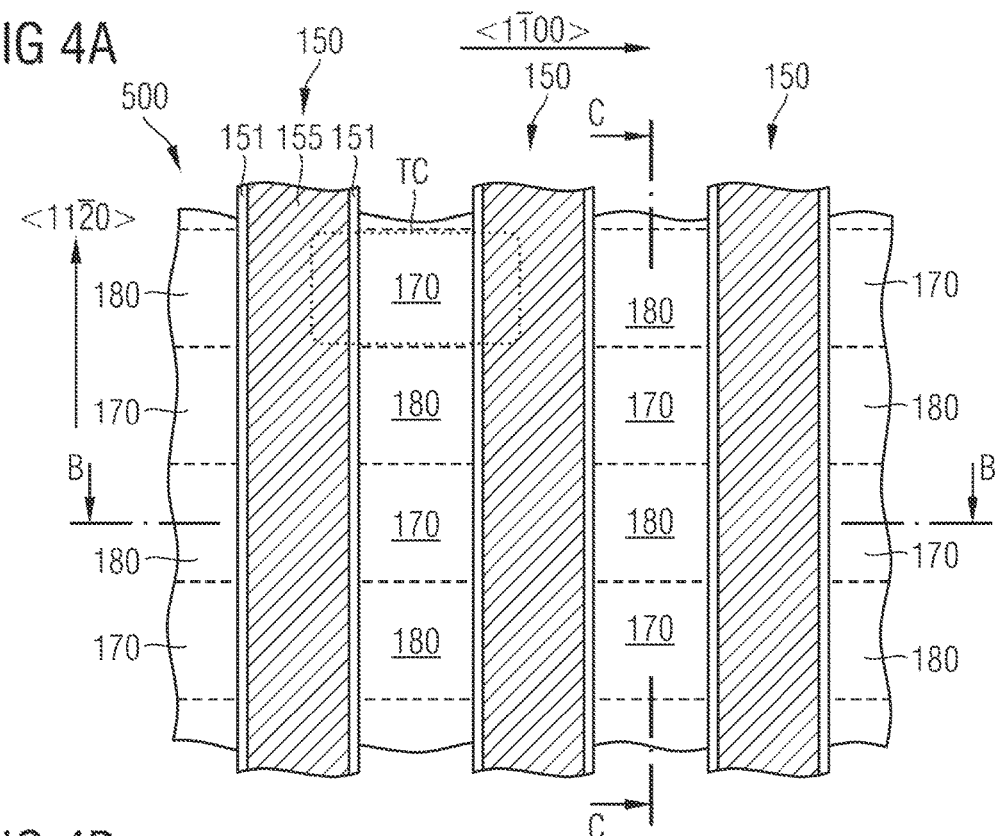
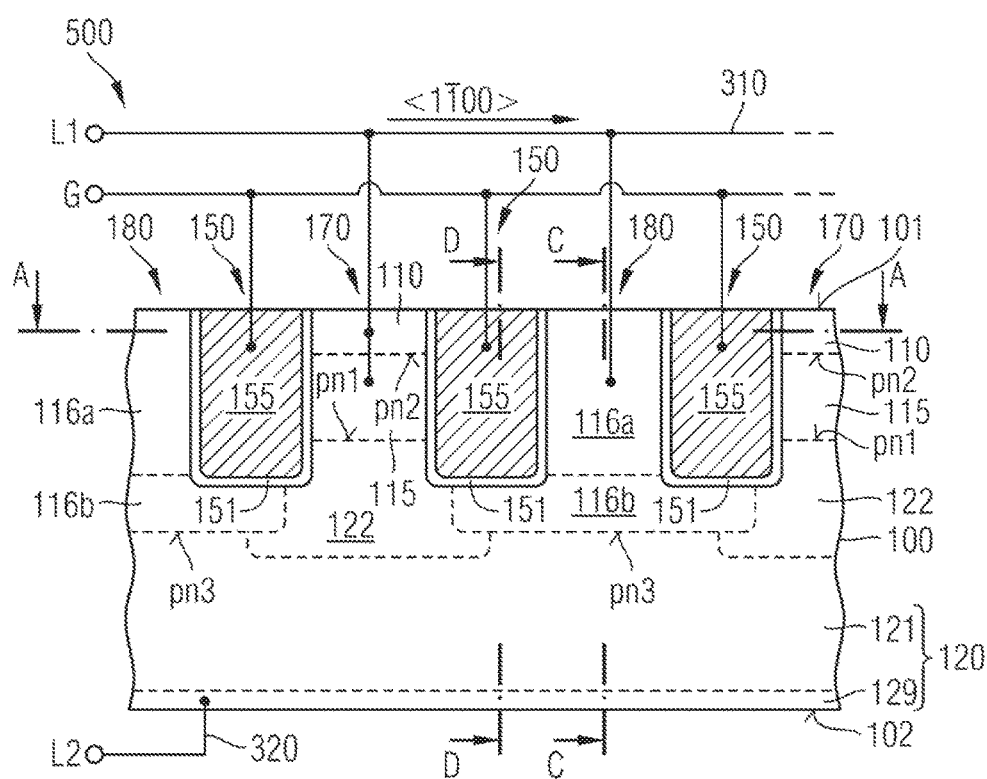

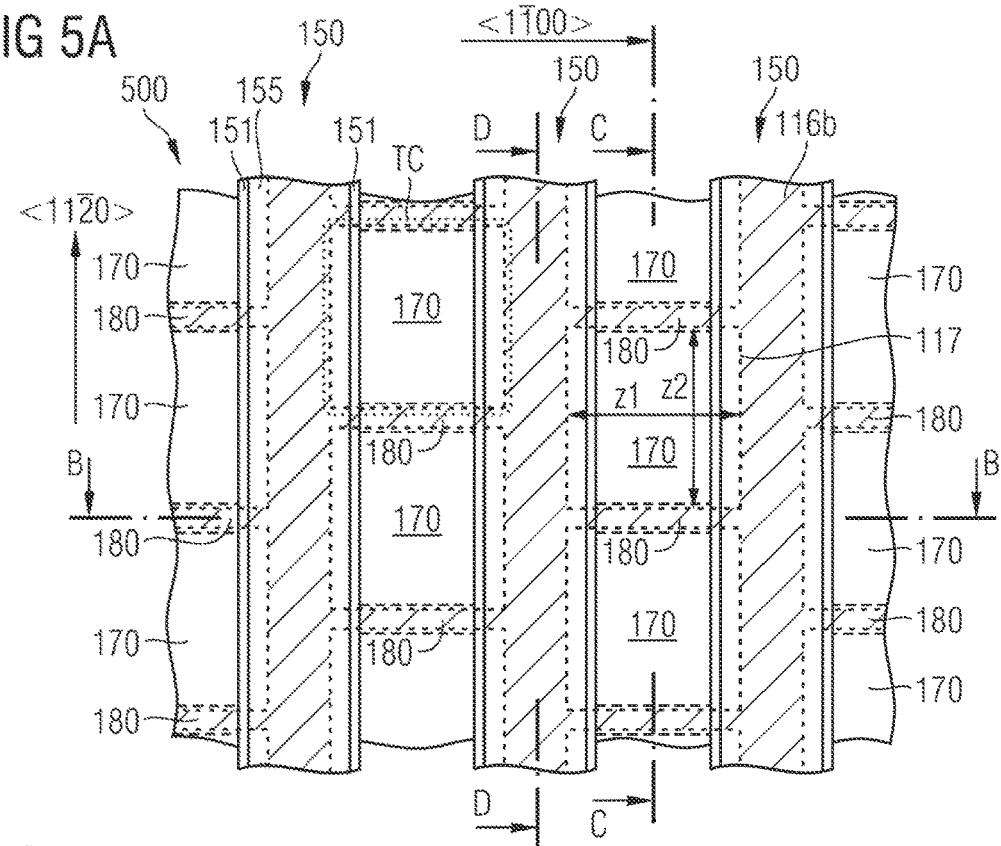
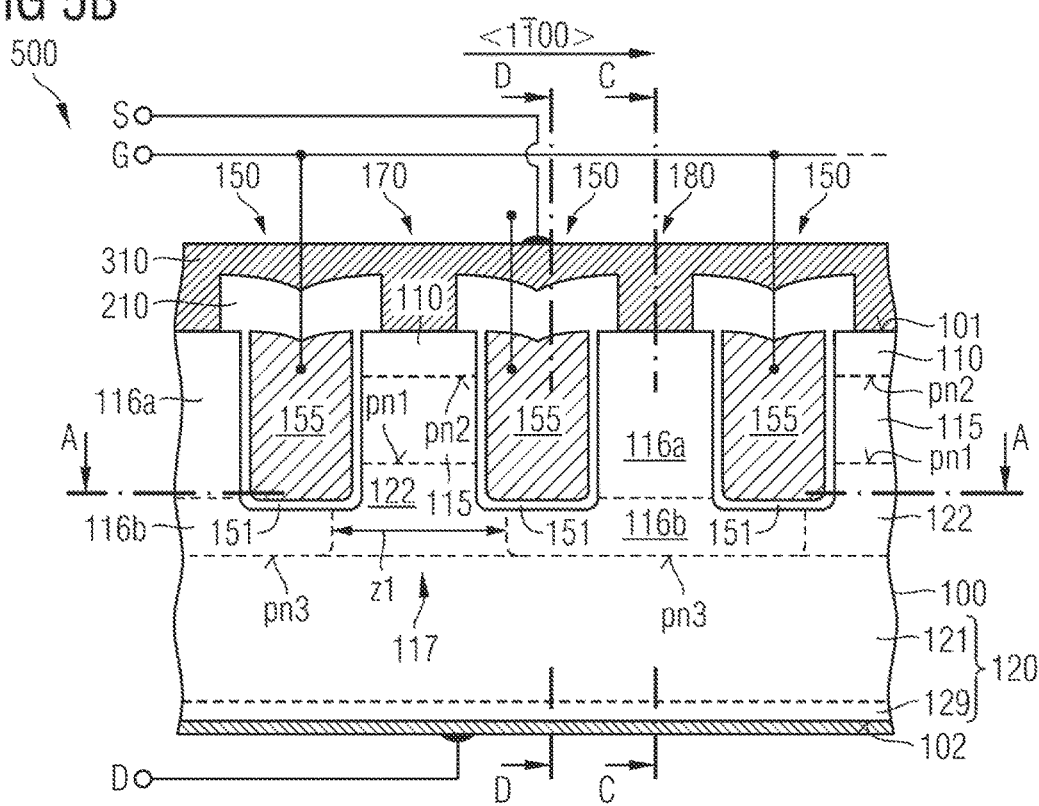

SEMICONDUCTOR DEVICE WITH STRIPE-SHAPED TRENCH GATE STRUCTURES, TRANSISTOR MESAS AND DIODE MESAS

PRIORITY CLAIM

This application claims priority to German Patent Application No. 10 2014 119 465.9 filed on 22 Dec. 2014, the content of said application incorporated herein by reference in its entirety.

BACKGROUND

Power semiconductor switches that are able to withstand a blocking voltage of several hundred Volts at high current rating are typically implemented as vertical transistors with a gate electrode formed in trenches in a semiconductor body, wherein the semiconductor body is based on a semiconducting material such as silicon (Si) or silicon carbide (SiC), by way of example.

It is desirable to improve the reliability of power semiconductor devices such as power semiconductor switches.

SUMMARY

According to an embodiment a semiconductor device includes stripe-shaped trench gate structures extending in a semiconductor body along a first horizontal direction. Transistor mesas between neighboring trench gate structures include body regions forming first pn junctions with a drift structure and second pn junctions with source zones, respectively. The source zones directly adjoin two neighboring trench gate structures, respectively. Diode mesas include at least portions of diode regions that form third pn junctions with the drift structure and that directly adjoin two neighboring trench gate structures, respectively. The transistor and diode mesas alternate at least along the first horizontal direction.

According to another embodiment a semiconductor device includes stripe-shaped trench gate structures in a semiconductor body from silicon carbide of a 4H polytype. The semiconductor body has a staggered first surface with first surface sections parallel to a crystal plane and second surface sections tilted to the first surface sections. The trench gate structures extend along a first horizontal direction orthogonal to steps formed by edges between the first and second surface sections. Transistor mesas between neighboring trench gate structures include body regions forming first pn junctions with a drift structure and second pn junctions with source zones, respectively. Diode mesas include at least portions of diode regions that form third pn junctions with the drift structure and that directly adjoin two neighboring trench gate structures, respectively. The transistor and diode mesas alternate at least along the first horizontal direction.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1A is a schematic horizontal cross-sectional view of a portion of a semiconductor device including transistor mesas and diode mesas alternating along longitudinal axes of trench gate structures, according to an embodiment.

FIG. 1B is a schematic vertical cross-sectional view of the semiconductor device portion of FIG. 1A orthogonal to the trench gate structures.

FIG. 4A is a schematic horizontal cross-sectional view of a portion of a semiconductor device according to an embodiment based on trench gate structures extending parallel to the <11-20> crystal direction and orthogonal to the (11-20 ) crystal planes.

FIG. 4B is a schematic cross-sectional view of the semiconductor device portion of FIG. 4A orthogonal to the trench gate structures.

FIG. 5A is a schematic horizontal cross-sectional view of a portion of a semiconductor device according to an embodiment concerning point symmetric openings in a shielding layer formed by portions of diode regions.

FIG. 5B is a schematic cross-sectional view of the semiconductor device portion of FIG. 5A orthogonal to the trench gate structures.

DETAILED DESCRIPTION

Figure 1C:
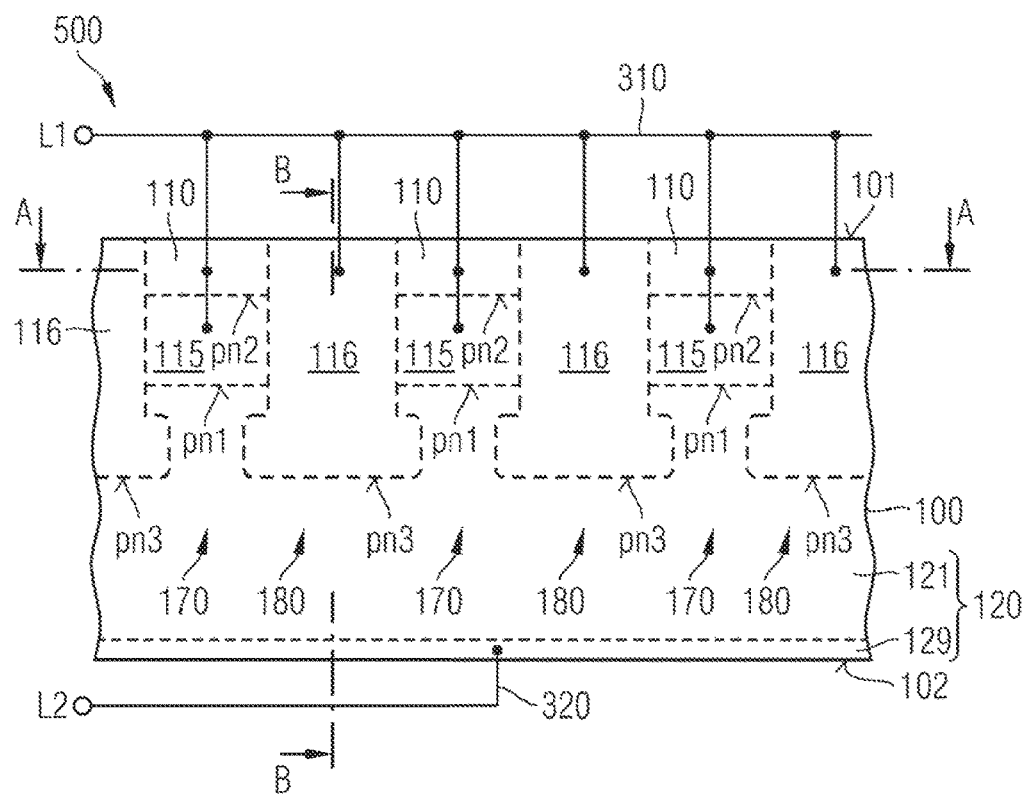
FIG. 1C is a schematic vertical cross-sectional view of the semiconductor device portion of FIG. 1A parallel to the trench gate structures and through the transistor and diode mesas.

In the following detailed description, reference is made to the accompanying drawings, which form a part hereof and in which are shown by way of illustrations specific embodiments in which the invention may be practiced. Other embodiments may be utilized and structural or logical changes may be made without departing from the scope of the present invention. For example, features illustrated or described for one embodiment can be used on or in conjunction with other embodiments to yield yet a further embodiment. The present invention may include such modifications and variations. The examples are described using specific language that should not be construed as limiting the scope of the appending claims.

The drawings are not to scale and are for illustrative purposes only. For clarity, the same or similar elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" may include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

FIGS. 1A to 1D refer to a semiconductor device 500 including transistor cells TC. The semiconductor device 500 may be or may include an IGFET (insulated gate field effect transistor), for example an MOSFET (metal oxide semiconductor FET) in the usual meaning including FETs with metal gates as well as FETs with non-metal gates, an IGBT (insulated gate bipolar transistor), or an MCD (MOS controlled diode), by way of example.

The semiconductor device 500 is based on a semiconductor body 100 from crystalline semiconductor material, such as silicon (Si), germanium (Ge), silicon germanium (SiGe), gallium arsenide (GaAs) or any other $A_{III}B_V$ semiconductor. According to an embodiment, the semiconductor body 100 is made of a single crystalline semiconductor material having a band gap of 2.0 eV or higher such as gallium nitride (GaN) or silicon carbide (SiC), for example 2H—SiC (SiC of the 2H polytype), 6H—SiC or 15R—SiC. According to an embodiment, the semiconductor material has a hexagonal crystal structure, e.g., silicon carbide of the 4H polytype (4H—SiC).

At a front side the semiconductor body 100 has a first surface 101, which may include approximately coplanar surface sections or which may include staggered, parallel surface sections tilted to a mean surface plane, respectively. On the back, an opposite second surface 102 may extend parallel to the coplanar surface sections of the first surface 101, parallel or tilted to the mean surface plane or may include staggered, parallel surface sections parallel to surface sections of the first surface 101. A distance between the first surface 101 at the front side and the second surface 102 on the back is selected to achieve a blocking voltage the semiconductor device is specified for and may be in the range of several hundred nm to several hundred μm. The normal to the first surface 101 defines a vertical direction. Directions parallel to the first surface 101 are horizontal directions.

The transistor cells TC are formed along stripe-shaped trench gate structures 150, which longitudinal axes extend along a first horizontal direction, and which extend along the vertical direction from the first surface 101 into the semiconductor body 100. The trench gate structures 150 may be equally spaced and may form a regular pattern, wherein a pitch (center-to-center distance) of the trench gate structures may be in a range from 1 μm to 10 μm, e.g., from 2 μm to 5 μm.

The trench gate structures 150 include a conductive gate electrode 155 which may include or consist of a heavily doped polycrystalline silicon layer or a metal-containing layer. The trench gate structures 150 further include a gate dielectric 151 separating the gate electrode 155 from the semiconductor body 100. The gate dielectric 151 capacitively couples the gate electrode 155 to the body zones 115 and may include or consist of a semiconductor dielectric, for example thermally grown or deposited semiconductor oxide, e.g., silicon oxide, a semiconductor nitride, for example deposited or thermally grown silicon nitride, a semiconductor oxynitride, for example silicon oxynitride, or any combination thereof.

Mesa portions of the semiconductor body 100 between neighboring trench gate structures 150 form transistor mesas 170 that include semiconducting portions of the transistor cells TC as well as diode mesas 180 that may include at least portions of a body diode.

The transistor mesas 170 include source zones 110 that are oriented to the front side and that may directly adjoin the first surface 101. The source zones 110 directly adjoin both neighboring trench gate structures 150 on opposite sides of the concerned transistor mesa 170. For example, each transistor mesa 170 includes two source zones 110, each of them directly adjoining one of the neighboring trench gate structures 150 and separated from each other by a contact structure or a p-doped region, which may be connected to the body zone 115. According to another embodiment, each source zone 110 may extend from one of the trench gate structures 150 adjoining the concerned transistor mesa 170 to the other, opposite trench gate structure 150.

The transistor mesas 170 further include body zones 115 that separate the source zones 110 from a drift structure 120, wherein the body zones 115 form first pn junctions pn1 with the drift structure 120 and second pn junctions pn2 with the source zones 110. Each body zone 115 extends from one of the trench gate structures 150 adjoining the concerned transistor mesa 170 to the other, opposite trench gate structure 150. Both the first pn junctions pn1 and the second pn junction pn2 may extend over the whole width of the transistor mesa 170 between the two trench gate structures 150 sandwiching the concerned transistor mesa 170. Both the source zones 110 and the body zones 115 are electrically connected to a first load electrode 310 at the front side.

The diode mesas 180 include at least portions of diode regions 116 that form third pn junctions pn3 with the drift structure 120 and that are electrically connected or coupled to the first load electrode 310. The diode region 116 of a diode mesa 180 extends from one of the neighboring trench gate structures 150 to the opposite one. The diode regions 116 may include portions outside the semiconductor mesas formed between neighboring trench gate structures 150, wherein a vertical extension of the diode regions 116 is greater than a vertical extension of the trench gate structures 150.

Figure 1D:
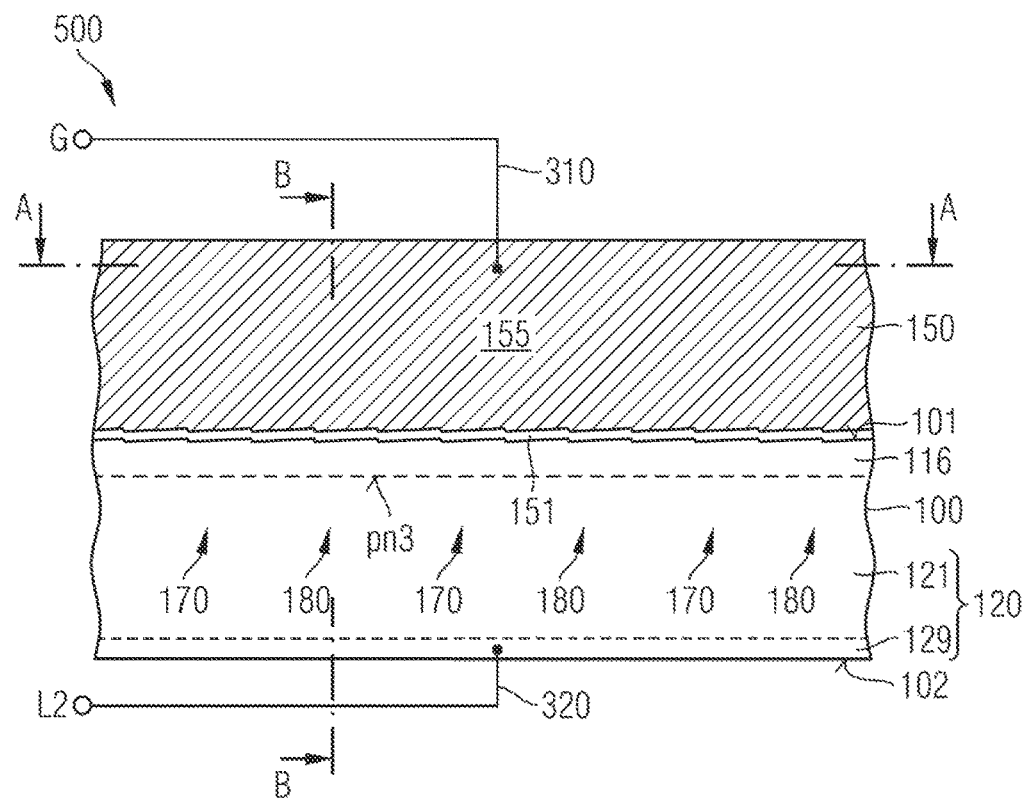
FIG. 1D is a schematic vertical cross-sectional view of the semiconductor device portion of FIG. 1A parallel to and through the trench gate structures.
Figure 2A:
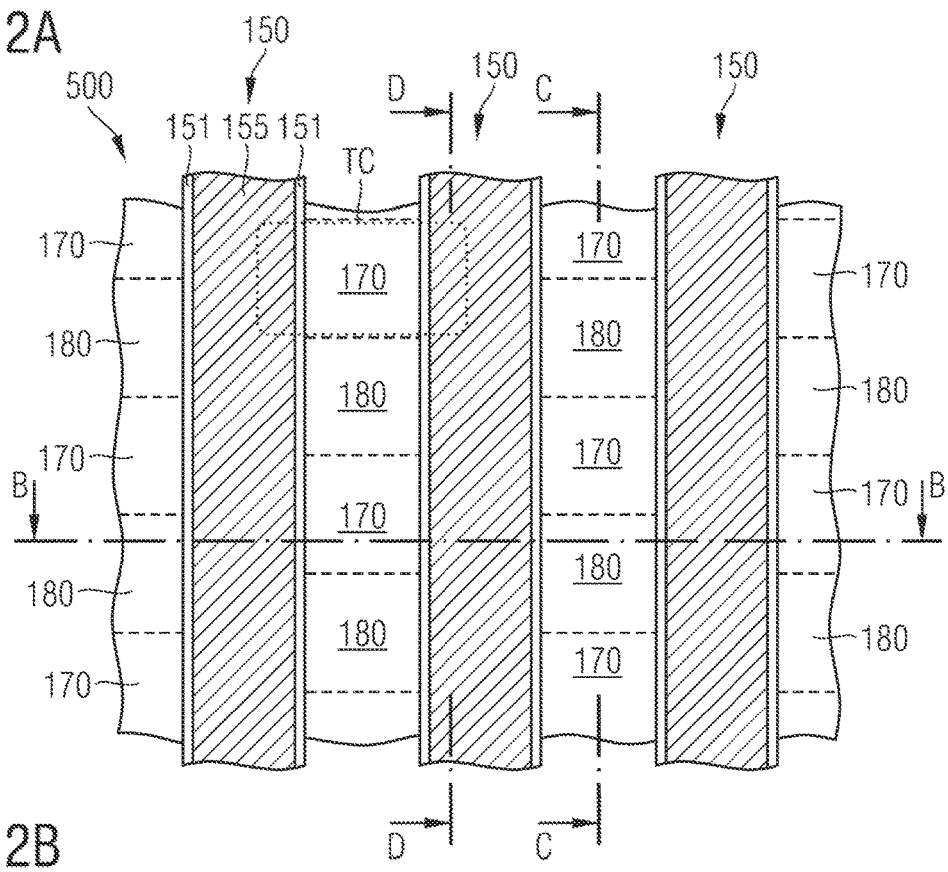
FIG. 2A is a schematic horizontal cross-sectional view of a portion of a semiconductor device with the transistor mesas and diode mesas alternating along only the longitudinal axes of the trench gate structures, according to an embodiment.
Figure 2B:
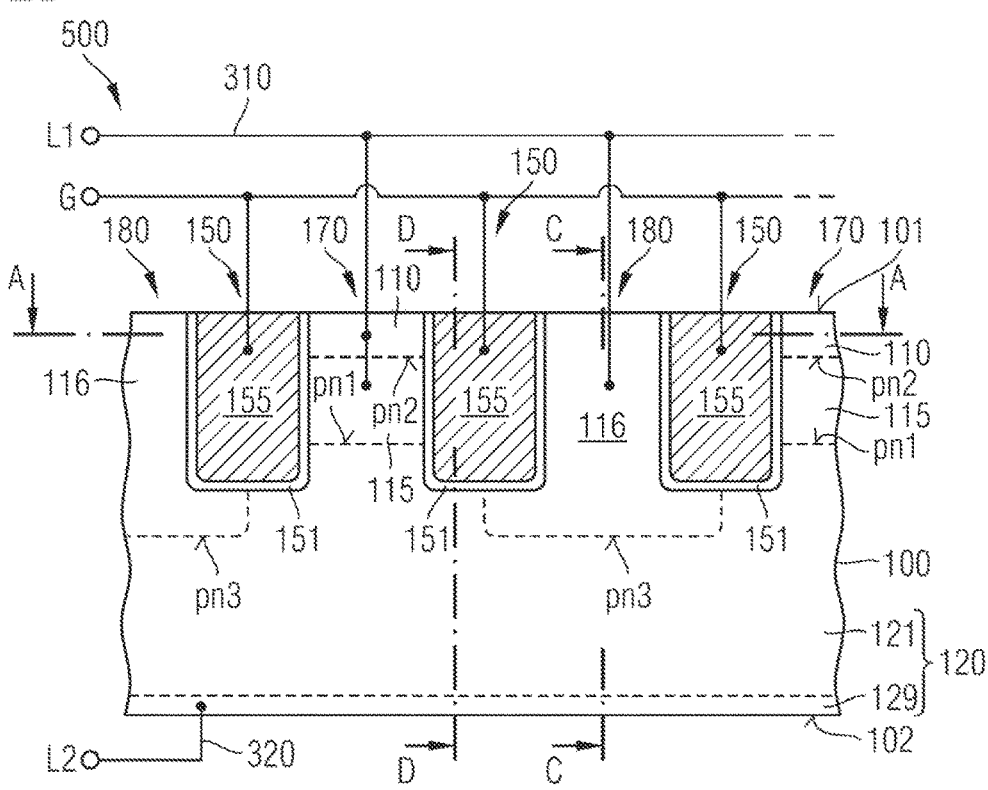
FIG. 2B is a schematic vertical cross-sectional view of the semiconductor device portion of FIG. 2A orthogonal to the trench gate structures.
Figure 2C:
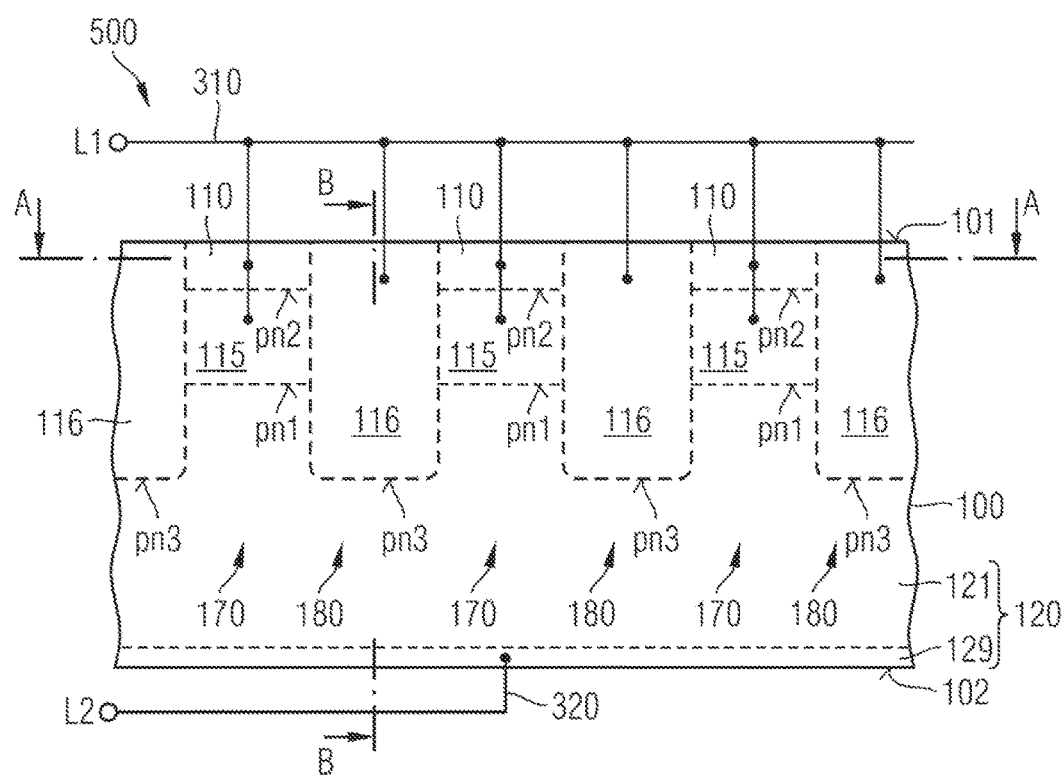
FIG. 2C is a schematic vertical cross-sectional view of the semiconductor device portion of FIG. 2A parallel to the trench gate structures and through the transistor and diode mesas.
Figure 2D:
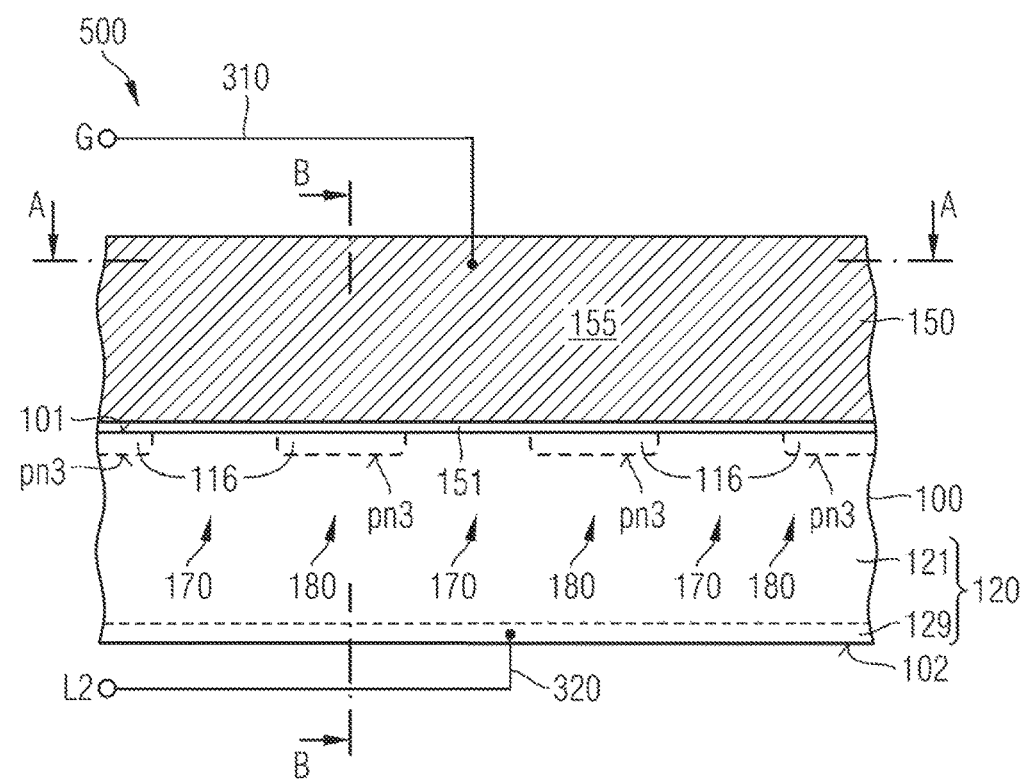
FIG. 2D is a schematic vertical cross-sectional view of the semiconductor device portion of FIG. 2A parallel to and through the trench gate structures.

As illustrated in FIGS. 1B to 1D, the diode regions 116 may vertically overlap with the trench gate structures 150 such that portions of the diode regions 116 are formed in the vertical projection of the trench gate structures 150 but spaced from the transistor mesas 170 along the horizontal direction. A distance between opposing edges of neighboring diode regions 116 may be in a range from 2 µm to 3 µm, by way of example.

The transistor mesas 170 and the diode mesas 180 alternate along the first horizontal direction or along both the first horizontal direction and the second horizontal direction, which is orthogonal to the first horizontal direction, wherein neighboring transistor and diode mesas 170, 180 directly adjoin to each other along the first horizontal direction and are separated from each other by intermediate trench gate structures 150 along the second horizontal direction.

The source zones 110 and at least portions of the diode regions 116 may result from complementary, masked implants using complementary implant masks. Since the trench gate structures 150 separate the transistor and diode mesas 170, 180 along the second horizontal direction, an alignment between the two implant masks is less critical along the second horizontal direction and the cell pitch along the second horizontal direction can be reduced.

According to another embodiment, a first implant for forming the source zones 110 may be unmasked, i.e., effective in both the transistor mesas 170 and the diode mesas 180 and a second, masked implant locally counter-dopes the first implant in the diode mesas 180. Again, the alignment of the implant mask for the second implant is less critical along the second horizontal direction such that the cell pitch along the second horizontal direction can be reduced.

The drift structure 120 is oriented to the back, may directly adjoin the second surface 102 and may be electrically connected or coupled to a second load electrode 320 through an ohmic contact or a further pn junction. The drift structure 120 may include a lightly doped drift zone 121 that may form the first and third pn junctions pn1, pn3 as well as a heavily doped contact layer 129 between the drift zone 121 and the second surface 102. The net dopant concentration in the drift zone 121 may be in a range from $1E14$ cm$^{-3}$ to $1E16$ cm$^{-3}$ in case the semiconductor body 100 is formed from silicon carbide.

A mean dopant concentration in the contact layer 129 is sufficiently high to ensure an ohmic contact with the second load electrode 320 that directly adjoins the second surface 102. In case the semiconductor device 500 is a semiconductor diode or an IGFET, the contact layer 129 has the same conductivity type as the drift zone 121. In case the semiconductor device 500 is an IGBT, the contact layer 129 has the complementary conductivity type of the drift zone 121 or includes zones of the complementary conductivity type.

Each of the first and second load electrodes 310, 320 may consist of or contain, as main constituent(s), aluminum (Al), copper (Cu), or alloys of aluminum or copper such as AlSi, AlCu or AlSiCu. According to other embodiments, at least one of the first and second load electrodes 310, 320 may contain, as main constituent(s), nickel (Ni), titanium (Ti), tungsten (W), tantalum (Ta), Vanadium (V), silver (Ag), gold (Au), tin (Sn), platinum (Pt), and/or palladium (Pd). One of the first and second load electrodes 310, 320 or both may include two or more sub-layers, wherein each sub-layer contains one or more of Ni, Ti, V, Ag, Au, W, Sn, Pt, and Pd as main constituent(s), e.g., a silicide, a nitride and/or an alloy.

The first load electrode 310 may form or may be electrically connected or coupled to a first load terminal L1, which may be an anode terminal of an MCD, a source terminal of an IGFET or an emitter terminal of an IGBT. The second load electrode 320 may form or may be electrically connected or coupled to a second load terminal L2, which may be a cathode terminal of an MCD, a drain terminal of an IGFET or a collector terminal of an IGBT.

According to an embodiment, the transistor cells TC are n-channel FET cells with p-doped body regions 115 and n-doped source zones 110, wherein the diode regions 116 are p-doped and the drift zone 121 is n-doped. According to another embodiment, the transistor cells TC are p-channel FET cells with n-doped body regions 115 and p-doped source zones 110, wherein the diode regions 116 are n-doped and the drift zone 121 is p-doped.

When a potential at the gate electrode 155 exceeds or falls below a threshold voltage of the semiconductor device 500, minority charge carriers in the body zones 115 form inversion channels connecting the source zones 110 with the drift structure 120, thereby turning on the semiconductor device 500. In the on-state, a load current flows through the semiconductor body 100 approximately along the vertical direction between the first and second load electrodes 310, 320.

The third pn junctions pn3 between the diode regions 116 and the drift zone 121 form a body diode that is conductive when the semiconductor device 500 is reverse biased with a negative voltage applied between the second load electrode 320 and the first load electrode 310 or under avalanche conditions. The body diode feature is useful, e.g., in applications switching inductive loads, for instance, in a half bridge circuit or in a full bridge circuit.

In the blocking state depletion zones extending from the vertical edges of the diode regions 116 below the trench gate structures 150 along the horizontal direction may completely deplete portions of the drift structure 120 in the vertical projection of the transistor mesas 170 and may shield active portions of the gate dielectric 151 of the transistor cells TC against the blocking voltage applied to the second load electrode 320. In this way, the diode regions 116 reduce the electric field across the gate dielectric 151 such that device reliability is increased and DIBL (drain-induced barrier lowering) is reduced.

Further, the diode regions 116 directly adjoin the body regions 115 along the first horizontal direction and electrically connect the body regions 115 with the first load electrode 310 without formation of deep contacts through the source zones 110 to the body zones 115, which formation may be a rather complex task in some semiconductor materials such as SiC and which safe alignment to the trench gate structures 150 may require a greater minimum pitch along the second horizontal direction.

In the on-state, minority charge carriers in the body zones 115 form two inversion channels on both sides of the each transistor mesa 170 such that in each transistor cell TC two inversion channels or MOS gated channels facilitate a unipolar current flow through the body zones 115 between the source zones 110 and the drift structure 120. Compared to layouts using only one sidewall of a transistor mesa for the formation of MOS gated channels, the active channel area is increased and, as a consequence, the on-state resistance reduced.

FIGS. 2A to 2D refer to an embodiment in which the transistor mesas 170 alternate with the diode mesas 180 exclusively along the first horizontal direction. Along the second horizontal direction the transistor mesas 170 of neighboring semiconductor mesas may be aligned to each other such that along the second horizontal direction the transistor mesas 170 are formed along lines separated by lines along which the diode mesas 180 are formed. According to other embodiments, the transistor mesas 170 in neighboring semiconductor mesas may be shifted to each other, e.g., by half a longitudinal extension of the transistor mesas 170 along the first horizontal direction or by any other fraction of the longitudinal extension.

The first surface 101 is a planar surface spanned by coplanar surface sections. For further details, reference is made to the detailed description of the semiconductor device 500 of FIGS. 1A to 1D. Each of the individual features of the semiconductor device 500 of FIGS. 2A to 2D can be combined with the further features of the semiconductor device 500 of FIGS. 1A to 1D.

The first surface 101 of the semiconductor body 100 as well as at least one of the sidewalls of the trench gate structures 150 may coincide with regular crystal planes or may be tilted at angles between 0 degree and 45 degree with respect to crystal planes, respectively. According to an embodiment, charge carrier mobility, e.g., electron mobility in case the transistor cells TC are n-channel FET cells, is equal in both crystal planes forming the sidewalls of the trench gate structures 150 along the longitudinal axes.

Figure 3A:
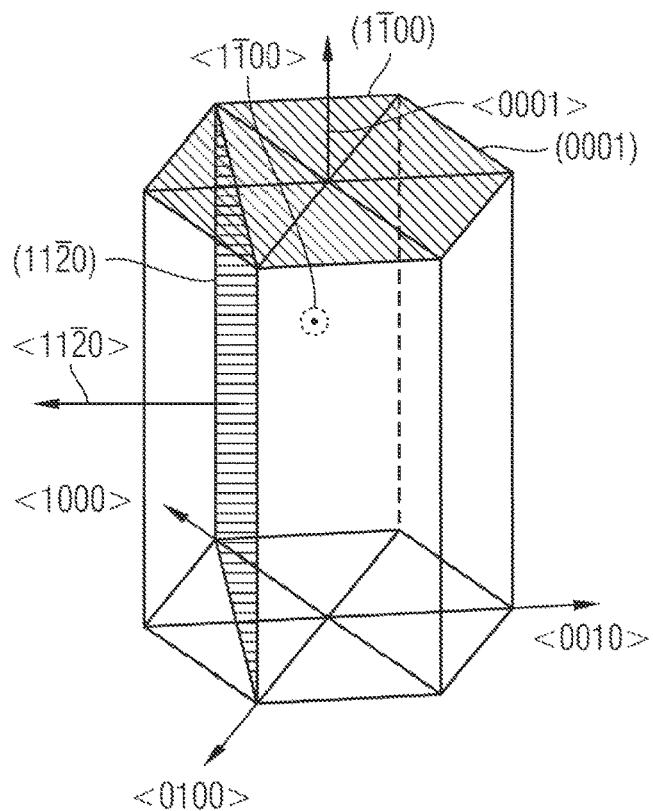
FIG. 3A is a schematic diagram illustrating the (11-20) crystal plane in a 4H—SiC crystal lattice for discussing effects of the embodiments.

FIG. 3A shows the crystal planes of the hexagonal crystal of 4H—SiC. Typically, a 4H—SiC wafer may be cut in or tilted to the basal (0001) plane. For example, a 4H—SiC crystal ingot is cut and/or a top surface of a 4H—SiC wafer obtained from a 4H—SiC crystal ingot may be polished at an off-axis angle in a range from 2 degree to 8 degree with respect to the basal plane such that the top surface of the 4H—SiC wafer shows long, flat, and slightly tilted terraces between short steep steps. During step-controlled epitaxy, silicon and carbon atoms impinging on the top surface grow onto the crystal, wherein the crystal growth starts at the steps. A top surface of an epitaxial layer grown on the top surface of a 4H—SiC wafer images steps of the 4H—SiC wafer substrate.

Figure 3B:
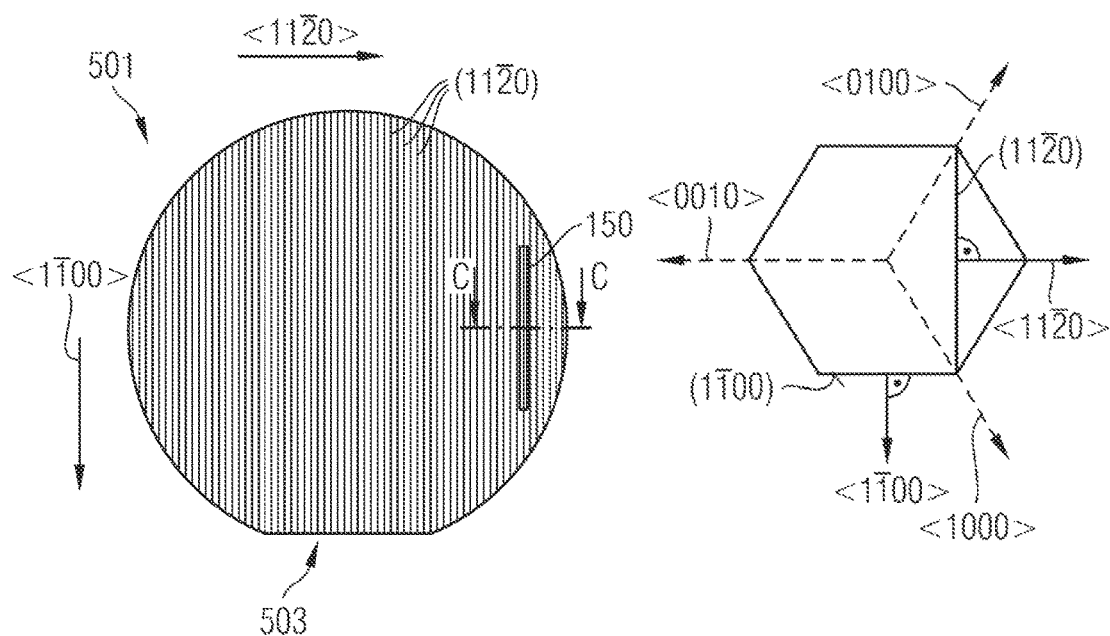
FIG. 3B is a schematic top view on a 4H—SiC wafer with a top surface including staggered (11-20) crystal planes.

FIG. 3B shows a top surface of a 4H—SiC wafer 501 cut and/or polished at an off-axis angle $\alpha$ between 2 degree and 8 degree, e.g., approximately 4 degree, with respect to the (0001) basal plane. The right-hand side of FIG. 3B shows a top view on a unit cell of a hexagonal crystal for illustrating the orientations of the crystal planes. The flat 503 on the periphery of the 4H—SiC wafer 501 marks the <11-20> crystal direction orthogonal to the (11-20) crystal planes. The <11-20> crystal direction is orthogonal to the <0001> crystal direction.

Figure 3C:
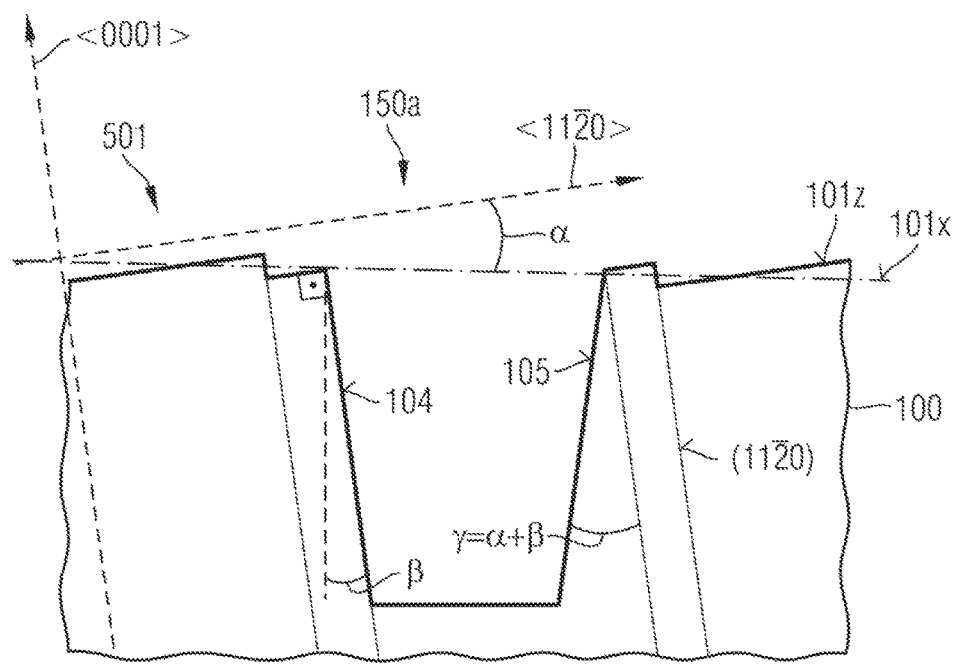
FIG. 3C is a schematic vertical cross-sectional view of a portion of the 4H—SiC wafer of FIG. 3B along line C—C for illustrating the orientation of steps at the top surface of the wafer with respect to a trench extending orthogonal to the <11-20> crystal direction and parallel to the (11-20) crystal planes.

Due to wafer cut and polishing tilted by the off-axis angle $\alpha$, the top surface 101z of the wafer includes long sections parallel to the <11-20> crystal direction and short sections parallel to the <0001> crystal direction as illustrated in FIG. 3C.

The steps are symmetric with respect to a mean surface plane 101x, which is tilted to the <11-20> crystal direction at the off-axis angle $\alpha$a. A trench 150a for a trench gate structure extends from the mean surface plane 101x into the semiconductor body 100 and may taper with increasing distance to the top surface 101z at a taper angle $\beta$ with respect to the vertical direction. If the taper angle $\beta$ and the off axis angle $\alpha$ are equal, a first sidewall 104 of the trench 150a is parallel to the (11-20) crystal planes, whereas an opposite second sidewall 105 is tilted to the (11-20) crystal planes by an angular misalignment $\gamma=\alpha+\beta$.

Since electron mobility strongly depends on the crystal orientation, an inversion channel formed along the second sidewall 105 is significantly less effective than an inversion channel formed along the first sidewalls 104.

In addition, the first and second sidewalls 104, 105 are only smooth and without steps if the horizontal direction along which they extend is perfectly parallel to the (11-20 ) crystal planes. At a slight angular misalignment between the crystal planes and the longitudinal axis of the trench 150a , the first and second sidewalls 104, 105 cut the (11-20 ) crystal planes. Then a high temperature process that precedes the formation of the gate dielectric 151, e.g., a doping activation anneal or a surface smoothing treatment, may form steps compensating the deviation of the longitudinal axis of the trench 150a from the (11-20) crystal planes. Such steps may locally change the characteristics of the inversion channels and may degrade device reliability.

According to an embodiment, the semiconductor body 100 with trench gate structures 150, transistor mesas 170 and diode mesas 180 as illustrated in FIGS. 1A to 1D is obtained from a 4H—SiC wafer which mean surface plane 101x has an off-axis angle a with respect to the basal plane. The trench gate structures 150 may be formed, by way of example, along the <11-20> crystal direction perpendicular to the (11-20 ) crystal plane. Sidewalls of the trench gate structures 150 have an angle of 90 degree with respect to the mean surface plane 101x.

Figure 3D:
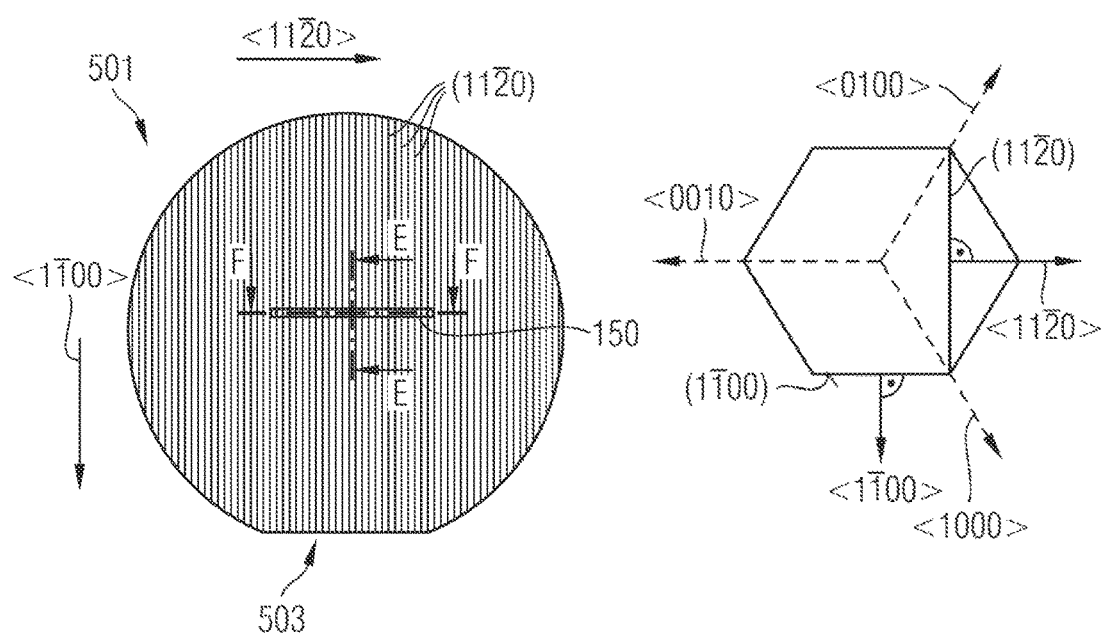
FIG. 3D is a schematic top view on a 4H—SiC wafer with trench gate structures extending along the <11-20> crystal direction and orthogonal to the (11-20) crystal planes according to an embodiment.
Figure 3E:
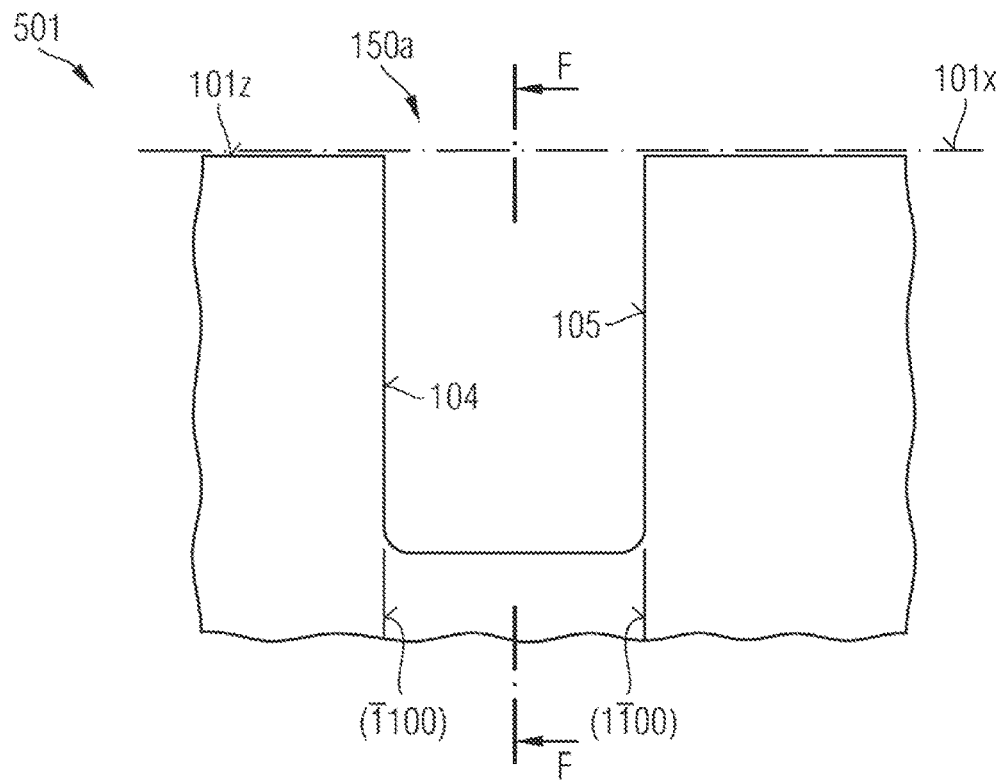
FIG. 3E is a schematic vertical cross-sectional view of a portion of the 4H—SiC wafer of FIG. 3D along line E-E for illustrating the orientation of steps at the top surface of the wafer with respect to a trench extending parallel to the <11-20> crystal direction and orthogonal to the (11-20) crystal planes.

As a result, one of the trench sidewalls is an (1-100) crystal plane and the other one a (-1100) crystal plane as shown in FIGS. 3D and 3E. Both sidewalls 104, 105 of the trench 150a have identical surface properties such that both trench sidewalls 104, 105 are identical with respect to the charge carrier mobility. Along both sidewalls 104, 105 a current density is equal and overall current distribution more uniform. The availability of both trench sidewalls compensates the inherently reduced electron mobility at the (−1100) and the (1-100) crystal planes, which is about 20% less than along the (11-20 ) crystal planes.

Figure 3F:
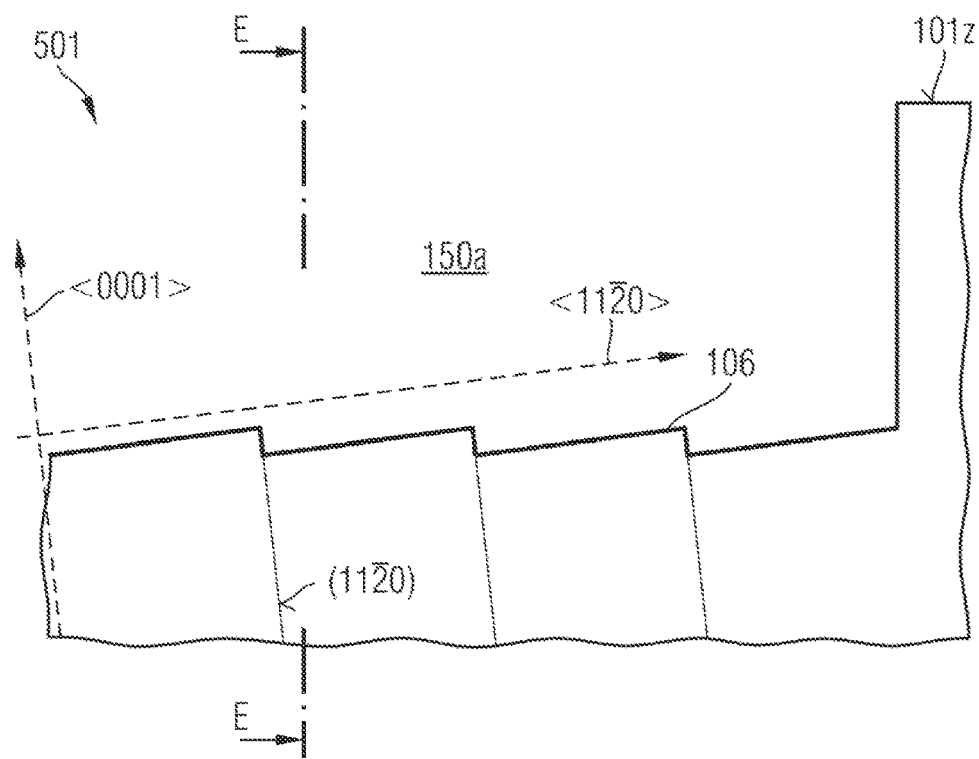
FIG. 3F is a schematic vertical cross-sectional view of a portion of the 4H—SiC wafer of FIG. 3D along line F-F.

FIG. 3F shows that steps may be formed at the bottom 106 of the trenches 150a but the smoothness of the longitudinal sidewalls 104, 105 of the trenches 150a and of the trench gate structures formed in the trenches 150a is not affected by the tilt at the top surface.

The semiconductor device 500 of FIGS. 4A to 4D is a silicon carbide IGFET based on the semiconductor device 500 of FIGS. 1A to 1D, wherein a first surface 101 of the semiconductor body 100 is a staggered surface with staggered first surface sections 101a formed by crystal planes and second surface sections 101b tilted to the first surface sections 101a and connecting the first surface sections 101a. The longitudinal axes of the trench gate structures 150 run orthogonal to steps 108 resulting from the different orientations of the first and second surface sections 101a, 101b in the staggered first surface 101.

Figure 4C:
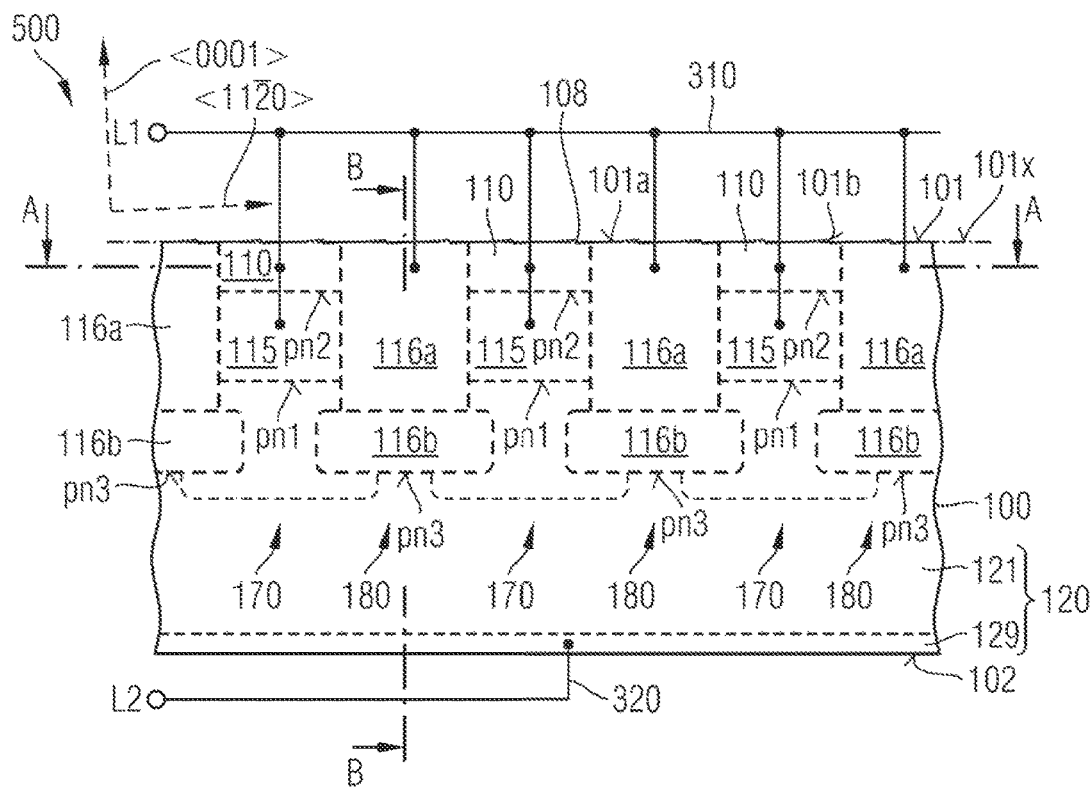
FIG. 4C is a schematic cross-sectional view of the semiconductor device portion of FIG. 4A parallel to the trench gate structures and through the diode and transistor mesas.
Figure 4D:
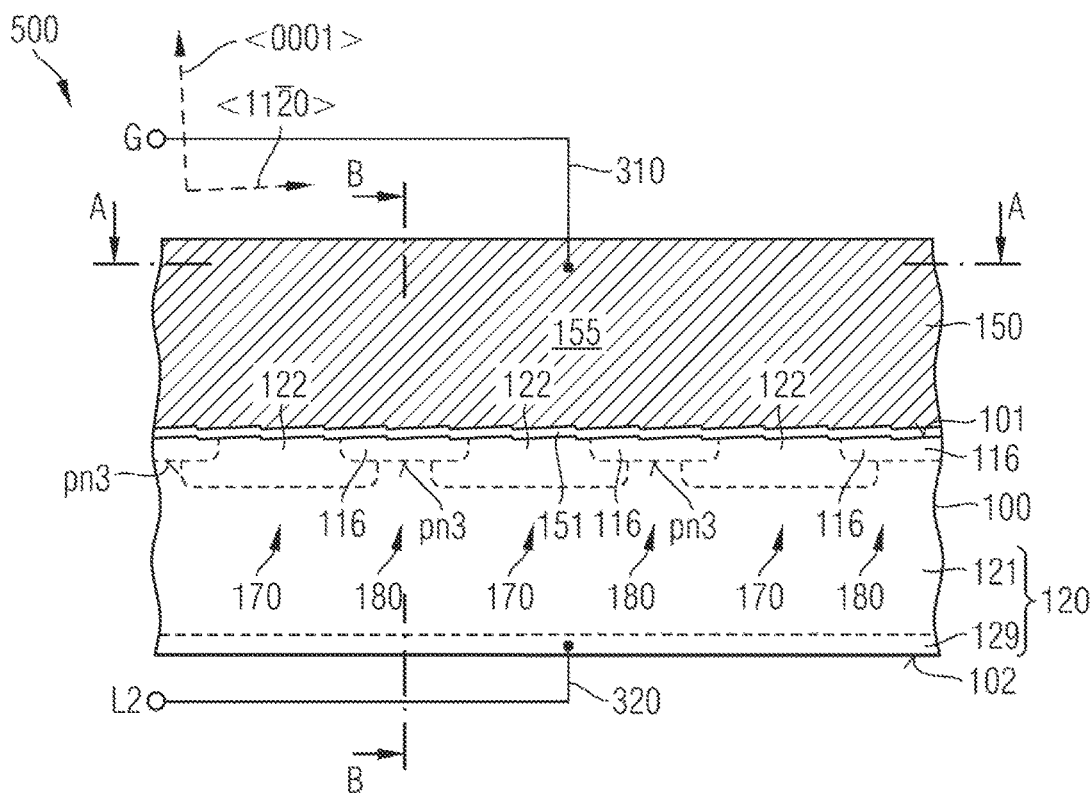
FIG. 4D is a schematic vertical cross-sectional view of the semiconductor device portion of FIG. 4A parallel to and through the trench gate structures.

According to the embodiment illustrated in FIG. 4C the first surface sections 101a may be (0001) crystal planes, a mean surface plane 101x cutting the steps 108 at half step height may be tilted to the <11-20> crystal direction at an off-axis angle α from 2 degree to 8 degree, and sidewalls of the transistor and diode mesas (170, 180) may be (−1100) and (1-100) crystal planes.

In addition, the diode regions 116 include shielding portions 116b, which directly adjoin the drift structure 120, and contact portions 116a connecting the shielding portions 116b with the first load electrode 310, respectively. A mean net dopant concentration in the contact portions 116a is at least twice as high as a mean net dopant concentration in the shielding portions 116b. The shielding portions 116b may include sections in a with respect to the first surface 101 vertical projection of the trench gate structures 150 but do not include portions in the vertical projection of the transistor mesas 170. A distance between neighboring shielding portions 116b may be between 2 μm and 3 μm, by way of example.

The drift structure 120 may include current spread zones 122 between the body zones 115 and the drift zone 121, wherein the current spread zones 122 may be sandwiched between the body zones 115 and the drift zone 121 or may be spaced from the body zones 115. A mean dopant concentration in the current spread zones 122 is at least twice, for example at least ten times as high as the mean dopant concentration in the drift zone 121. The reduced lateral ohmic resistance in the current spread zones 122 spreads the charge carrier flow through the body zones 115 along the horizontal directions such that a more uniform current distribution is achieved in the semiconductor body 100 even at a low dopant concentration in the drift zone 121.

According to the illustrated embodiment the current spread zones 122 directly adjoin the body zones 115 and are formed between neighboring shielding portions 116b. Unipolar homojunctions between the current spread zones 122 and the drift zone 121 may have a greater distance to the first surface 101 than the third pn junctions pn3 formed between the diode regions 116 and the drift zone 121. The current spread zones 122 may be formed exclusively in the horizontal projection of the adjoining diode regions 116 or may overlap with the shielding portions 116b such that portions of the current spread zones 122 are formed in the vertical projection of the shielding portions 116b. According to another embodiment, the current spread zones 122 may form a contiguous layer between the shielding portions 116b and the drift zone 121.

The shielding portions 116b may be formed on top of the drift zone 121 in the same implant step as the contact portions 116a. According to other embodiments, the shielding portions 116b are formed independently from the contact portions 116a, for example by using another lithographic mask.

FIGS. 5A to 5D illustrate a semiconductor device 500 with the shielding portions 116b formed as a layer with point-symmetric openings centered to the transistor mesas 170.

FIG. 5A shows a horizontal cross-sectional view in a plane cutting through the shielding portions 116b. The shielding portions 116b form a contiguous shielding layer with openings 117 centered to the transistor mesas 170. The openings 117 may be point-symmetric with respect to the center of the transistor mesas 170 such that a width z1 of the openings 117 orthogonal to the first horizontal direction is equal to a width z2 of the openings 117 along the first horizontal direction. In the blocking mode depletion zones extend along all four horizontal directions into the direction of the transistor mesas 170 and effectively shield the active portions of the gate dielectric 151. The openings 117 may be point-symmetric, for example squares, octagons or other regular polygons.

The horizontal cross-sectional are of the diode mesas 180 can be significantly reduced without reducing the shielding effect of the diode regions 116 and, as a consequence, the effective transistor area can be increased.

Figure 5C:
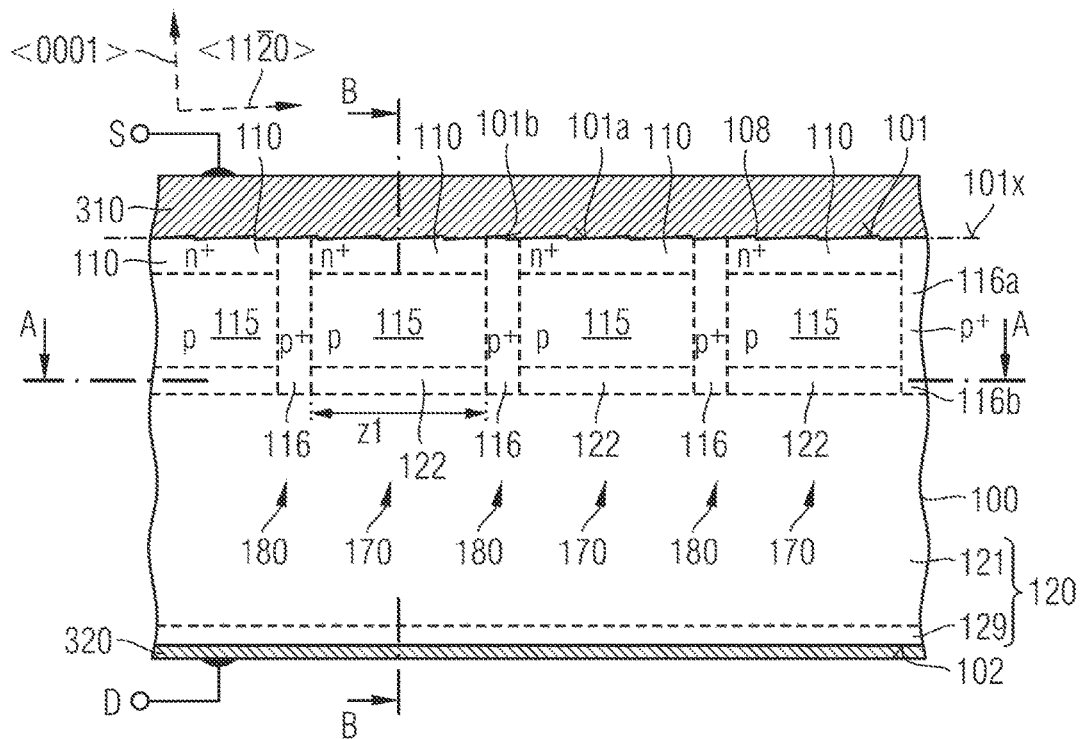
FIG. 5C is a schematic cross-sectional view of the semiconductor device portion of FIG. 5A parallel to the trench gate structures and through the diode and transistor mesas.
Figure 5D:
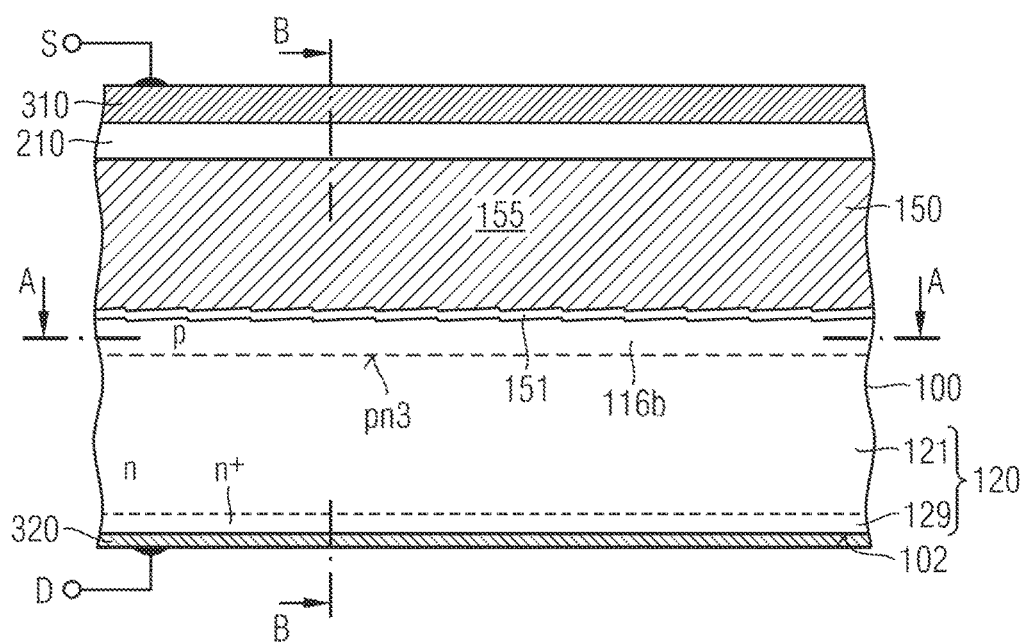
FIG. 5D is a schematic vertical cross-sectional view of the semiconductor device portion of FIG. 5A parallel to and through the trench gate structures.

FIGS. 5B to 5D further show an interlayer dielectric 210 sandwiched between the first load electrode 310 and the gate electrode 155. The interlayer dielectric 210 dielectrically insulates the first load electrode 310 from the gate electrode 155 and may include one or more dielectric layers from silicon oxide, silicon nitride, silicon oxynitride, doped or undoped silicate glass, for example BSG (boron silicate glass), PSG (phosphorus silicate glass) or BPSG (boron phosphorus silicate glass), by way of example.

Figure 6A:
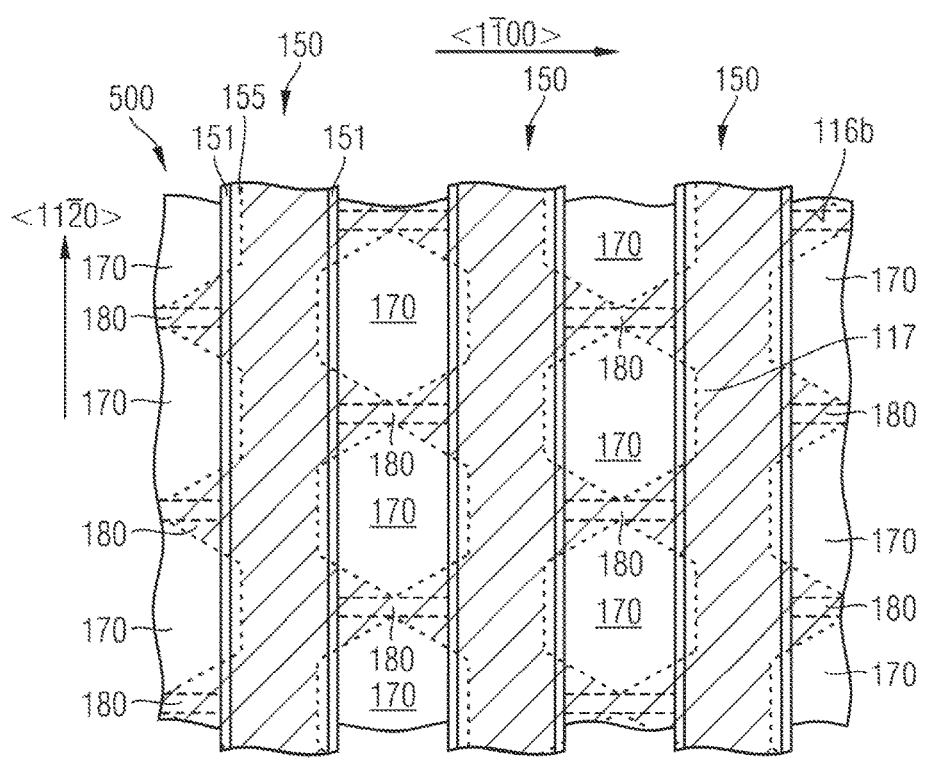
FIG. 6A is a schematic horizontal cross-sectional view of a portion of a semiconductor device according to an embodiment concerning hexagonal openings in a shielding layer formed by portions of diode regions.

FIG. 6A shows a semiconductor device 500 which shielding portions 116b form a contiguous shielding layer with hexagonal openings 117.

Figure 6B:
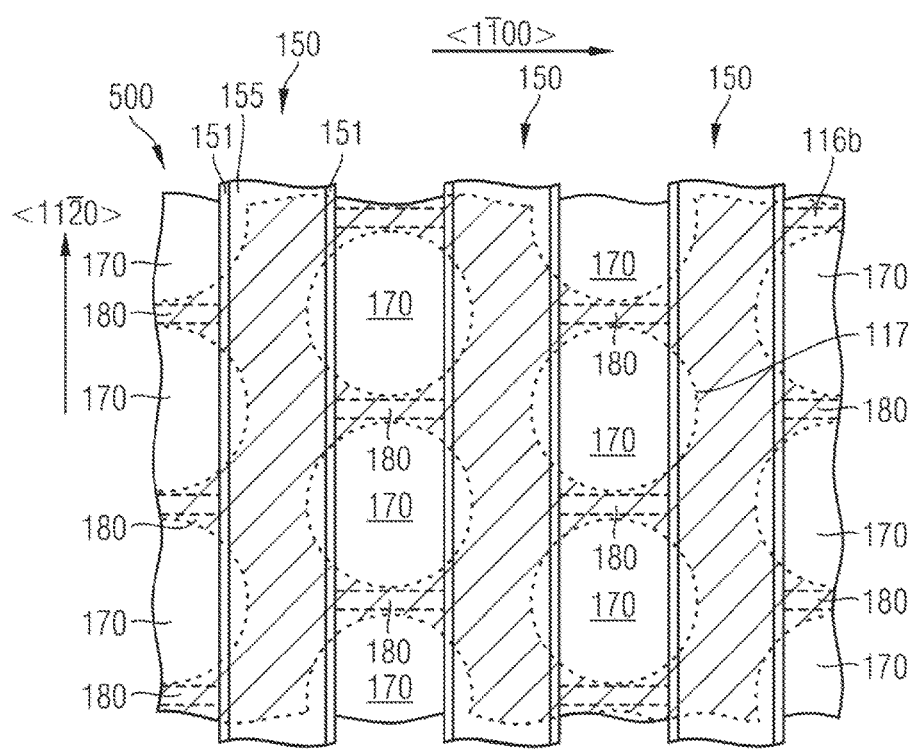
FIG. 6B is a schematic horizontal cross-sectional view of a portion of a semiconductor device according to an embodiment concerning circular openings in a shielding layer formed by portions of diode regions.

FIG. 6B shows a semiconductor device 500 which shielding layer has circular openings 117.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A semiconductor device comprising:
   stripe-shaped trench gate structures extending into a first surface of a semiconductor body, the semiconductor body based on a semiconductor material with hexagonal crystal lattice, wherein trench sidewalls of the trench gate structure are aligned with (1-100) and (−1100) crystal planes; and
   transistor mesas between neighboring trench gate structures, the transistor mesas comprising body regions forming first pn junctions with a drift structure and second pn junctions with source zones;

diode mesas between neighboring trench gate structures, the diode mesas comprising diode regions that directly adjoin the neighboring trench gate structures and form a third p-n junction with the drift structure, wherein the diode regions form contiguous regions extending from the first surface of the semiconductor body to a bottom of the diode regions that is coextensive with the third p-n junction, wherein between central bottoms of two of the neighboring trench gate structures, the bottom of the diode regions extends continuously along a plane that is parallel to the first surface and is beneath the central bottoms of the two of the neighboring trench gate structures, wherein each of the diode regions comprise a contact portion and a shielding portion, wherein the contact portion extends from the first surface to the shielding portion, wherein the contact portion extends deeper into the semiconductor body than the body regions, wherein the shielding portion extends from the contact portion to the bottom of the diode regions, and wherein a mean net dopant concentration in the contact portions is higher than a mean net dopant concentration in the shielding portions.

2. The semiconductor device of claim 1, wherein the shielding portions include sections that do not vertically overlap with the transistor mesas.

3. The semiconductor device of claim 1, wherein the drift structure comprises a lightly doped drift zone and current spread zones between the drift zone and the body regions, and a mean net dopant concentration in the current spread zones is at least twice as high as a mean net dopant concentration in the drift zone.

4. The semiconductor device of claim 1, wherein charge carrier mobility is equal along both longitudinal sidewalls of the trench gate structures.

5. The semiconductor device of claim 1, wherein the source zones directly adjoin to two neighboring trench gate structures, respectively.

6. The semiconductor device of claim 1, wherein a first surface of the semiconductor body from which the trench gate structures extend into the semiconductor body is a staggered surface with first surface sections formed by (0001) crystal planes and second surface sections connecting the first surface sections and wherein longitudinal axes of the trench gate structures run orthogonal to steps resulting from different orientations of the first and second surface sections in the staggered first surface.

7. The semiconductor device of claim 6, wherein a mean surface plane cutting the steps at half step height is substantially parallel to the <11-20> crystal plane of the semiconductor material.

8. The semiconductor device of claim 1, wherein the transistor and diode mesas further alternate, separated by the trench gate structures, along a second horizontal direction orthogonal to the first horizontal that is parallel to the trench sidewalls and a first surface of the semiconductor body.

9. The semiconductor device of claim 1, wherein a first length of the transistor mesas along a first horizontal direction that is parallel to the trench sidewalls and a first surface of the semiconductor body and a second length of the diode mesas along the first horizontal direction are equal.

10. The semiconductor device of claim 1, wherein a first length of the transistor mesas along the first horizontal direction is parallel to the trench sidewalls and a first surface of the semiconductor body is greater than a second length of the diode mesas along the first horizontal direction.

11. The semiconductor device of claim 1, wherein portions of the diode regions in a distance to the first surface greater than a vertical extension of the trench gate structures form a contiguous shielding layer with openings centered to the transistor mesas.

12. The semiconductor device of claim 11, wherein the openings are rotational-symmetric.

13. The semiconductor device of claim 11, wherein the openings are circular openings.

14. The semiconductor device of claim 1, wherein ohmic contacts of the source zone and diode regions are formed along the first surface.

15. The semiconductor device of claim 1, wherein the semiconductor body is formed from 4H—SiC.

16. The semiconductor device of claim 1, wherein the stripe-shaped trench gate structures extend in a horizontal direction parallel to a <11-20> crystal direction.

17. The semiconductor device of claim 1, wherein the mean net dopant concentration in the contact portions is at least twice as high as the mean net dopant concentration in the shielding portions.

18. A semiconductor device comprising:
stripe-shaped trench gate structures in a semiconductor body based on a semiconductor material with hexagonal crystal lattice, wherein trench sidewalls of the trench gate structure are aligned with (1-100) and (−1100) crystal planes;
transistor mesas between neighboring trench gate structures, the transistor mesas comprising body regions forming first pn junctions with a drift structure and second pn junctions with source zones; and
diode mesas comprising at least portions of diode regions that form third pn junctions with the drift structure and that directly adjoin two neighboring trench gate structures, respectively,
wherein the transistor and diode mesas alternate at least along a first horizontal direction, the first horizontal direction being parallel to the trench sidewalls and a first surface of the semiconductor body,
wherein portions of the diode regions in a distance to the first surface greater than a vertical extension of the trench gate structures form a contiguous shielding layer with openings centered to the transistor mesas, and
wherein the openings are circular openings.

19. A semiconductor device comprising:
stripe-shaped trench gate structures extending into a first surface of a semiconductor body, the semiconductor body based on a semiconductor material with hexagonal crystal lattice, wherein trench sidewalls of the trench gate structure are aligned with (1-100) and (−1100) crystal planes; and
transistor portions between neighboring trench gate structures, the transistor portions comprising body regions forming first pn junctions with a drift structure and second pn junctions with source zones;
diode portions between neighboring trench gate structures, the diode portions comprising diode regions that directly adjoin the neighboring trench gate structures and form a third p-n junction with the drift structure,
wherein the diode portions form a contiguous region extending from the first surface of the semiconductor body to a bottom of the diode region that is coextensive with the third p-n junction, and wherein from between central bottoms of two of the neighboring trench gate structures, the bottom of the diode portions extends continuously along a plane that is parallel to the first surface and is beneath the central bottoms of the two of the neighboring trench gate structures, wherein each of the diode regions comprise a contact portion and a shielding portion, wherein the contact portion extends from the first surface to the shielding portion, wherein the contact portion extends deeper into the semiconductor body than the body regions, wherein the shielding portion extends from the contact portion to the bottom of the diode regions, and wherein a mean net dopant concentration in the contact portions is higher than a mean net dopant concentration in the shielding portions.

* * * * *

UNITED STATES PATENT AND TRADEMARK OFFICE
CERTIFICATE OF CORRECTION

PATENT NO. : 10,304,953 B2
APPLICATION NO. : 14/975385
DATED : May 28, 2019
INVENTOR(S) : T. Aichinger et al.

Page 1 of 1

It is certified that error appears in the above-identified patent and that said Letters Patent is hereby corrected as shown below:

In the Claims

Column 11, Line 43 (Claim 6, Line 2) please change "a first" to -- the first --
Column 11, Line 59 (Claim 8, Line 4) please change "horizontal that" to -- horizontal direction that --
Column 12, Line 2 (Claim 10, Line 2) please change "along the first" to -- along a first --
Column 12, Line 3 (Claim 10, Line 3) please change "direction is" to -- direction that is --
Column 12, Line 62 (Claim 19, Line 12) please change "diode portions" to -- diode mesas --
Column 12, Line 63 (Claim 19, Line 13) please change "diode portions" to -- diode mesas --
Column 12, Line 66 (Claim 19, Line 16) please change "diode portions" to -- diode regions --
Column 13, Line 5 (Claim 19, Line 22) please change "diode portions" to -- diode regions --

Signed and Sealed this
Thirtieth Day of July, 2019

Andrei Iancu
*Director of the United States Patent and Trademark Office*